US012719456B2

(12) United States Patent
Singareddy et al.

(10) Patent No.: US 12,719,456 B2
(45) Date of Patent: Aug. 25, 2026

(54) CIRCUIT COMPONENT SHARING PROTOCOL

(71) Applicant: TEXAS INSTRUMENTS INCORPORATED, Dallas, TX (US)

(72) Inventors: Bharath Kumar Singareddy, Bangalore (IN); Srinivas Theertham, Bangalore (IN); Abhijit Bhattacharya, Bengaluru (IN); Visvesvaraya Appala Pentakota, Bangalore (IN); Manoj Katta Venkata, Bangaluru (IN); Soumi Paul, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/902,657

(22) Filed: Sep. 30, 2024

(65) Prior Publication Data

US 2026/0095158 A1 Apr. 2, 2026

(51) Int. Cl.

| | |
|---|---|
| ***H03K 3/00*** | (2006.01) |
| ***H03K 3/037*** | (2006.01) |
| ***H03K 5/01*** | (2006.01) |
| *H03K 5/00* | (2006.01) |

(52) U.S. Cl.

CPC ............... *H03K 3/037* (2013.01); *H03K 5/01* (2013.01); *H03K 2005/00078* (2013.01)

(58) Field of Classification Search

CPC ..................... H03K 3/037; H03K 5/01; H03K 2005/00078; H03K 2217/960725; H03M 1/1245; H03M 1/1215; H03M 1/466; H03M 1/122; H03M 3/496

See application file for complete search history.

(56) References Cited

U.S. PATENT DOCUMENTS

| | | | | |
|---|---|---|---|---|
| 6,642,747 | B1 | 11/2003 | Chiu | |
| 8,878,707 | B1 * | 11/2014 | Wang | H03M 1/0836 341/172 |
| 2008/0231324 | A1 | 9/2008 | Liu | |
| 2013/0207827 | A1 * | 8/2013 | Nestler | H03H 7/0138 341/172 |
| 2018/0329576 | A1 * | 11/2018 | Kim | G06F 3/04182 |
| 2019/0095031 | A1 * | 3/2019 | Lee | G06F 3/04166 |
| 2024/0187016 | A1 * | 6/2024 | Parupalli | H03M 1/804 |

* cited by examiner

*Primary Examiner* — Tuan T Lam

(74) *Attorney, Agent, or Firm* — Xianghui Huang; Frank D. Cimino

(57) ABSTRACT

An apparatus includes a first D flip-flop including a first data output, a first negative edge-triggered clock input, and a first reset input, and a second D flip-flop including a second data output, a second negative edge-triggered clock input, and a second reset input. The apparatus includes a logic gate having an output and first and second inputs, the first input of the logic gate coupled to the first data output, and the second input of the logic gate coupled to the second data output, in which the output of the logic gate is configured to be a first clock output of the apparatus. A delay circuit of the apparatus includes an output and input, the output of the delay circuit coupled to the first and second reset inputs, and the input of the delay circuit coupled to the output of the logic gate.

7 Claims, 10 Drawing Sheets

900

902a
904a CIRCUIT
906a CIRCUIT
908a CIRCUIT
910a CIRCUIT
912a
914a
916a
918a
922a
924a 902b
904b CIRCUIT
906b CIRCUIT
908b CIRCUIT
910b CIRCUIT
912b
914b
916b
918b
922b
924b 902c
904c CIRCUIT
906c CIRCUIT
908c CIRCUIT
910c CIRCUIT
912c
914c
916c
918c
922c
924c 902d
904d CIRCUIT
906d CIRCUIT
908d CIRCUIT
910d CIRCUIT
912d
914d
916d
918d
922d
924d

SEQUENCE CIRCUIT 920

1002
CLK_A
CLKA_S

1004
CLK_B
CLKB_S

1006
CLK_C
CLKC_S

1008
CLK_D
CLKD_S

[VOLT]
1.0
0.5
0.0

0
100
200
300
400
500
600
700
800
UI/200 [SEC]

CIRCUIT COMPONENT SHARING PROTOCOL

BACKGROUND

The technology industry strives to miniaturize devices while maintaining device functionality. Engineers may reduce device size by improving circuit efficiency, such as by designing circuits that share one or more components among multiple elements. For example, a circuit that uses four identical instances of a particular component may be redesigned so that a single instance of the component is shared among multiple circuit elements. This significantly lowers both physical size and manufacturing cost by efficiently utilizing resources.

SUMMARY

In examples, an apparatus includes a first D flip-flop including a first data output, a first negative edge-triggered clock input, and a first reset input, and a second D flip-flop including a second data output, a second negative edge-triggered clock input, and a second reset input. The apparatus includes a logic gate having an output and first and second inputs, the first input of the logic gate coupled to the first data output, and the second input of the logic gate coupled to the second data output, in which the output of the logic gate is configured to be a first clock output of the apparatus. A delay circuit of the apparatus includes an output and input, the output of the delay circuit coupled to the first and second reset inputs, and the input of the delay circuit coupled to the output of the logic gate.

In examples, an electronic device includes a first switch including a terminal and a second switch including first and second terminals. The electronic device includes a first capacitor coupled to the terminal of the first switch and the first terminal of the second switch, a third switch including a terminal, a fourth switch including first and second terminals, and a second capacitor coupled to the terminal of the third switch and the first terminal of the fourth switch. The electronic device includes an electronic component coupled to the second terminals of the second and fourth switches. The electronic device includes a first clock generator coupled to control terminals of the first and third switches, where the first clock generator is configured to generate first and second clock signals to operate the first and third switches. The electronic device includes a second clock generator coupled to control terminals of the second and fourth switches and to the first clock generator, where the second clock generator is configured to generate third and fourth clock signals to close the second and fourth switches at mutually exclusive times.

In examples, a device includes a first flip-flop including a first data output, a first clock input, and a first reset input, in which the first clock input is configured to receive a clock signal, the clock signal indicating a state of a switch coupling an Ethernet channel to a capacitor. The device includes second and third flip-flops configured to provide flip-flop output signals indicating whether any of a plurality of capacitors is coupled to a shared circuit component. The device includes a multiplexer including an output, first and second inputs, and a select input, in which the first input of the multiplexer is coupled to the second flip-flop, the second input of the multiplexer is coupled to the third flip-flop, and the multiplexer is configured to provide one of the flip-flop output signals to the output of the multiplexer. The device includes a logic gate including an output and first and second inputs, in which the first input of the logic gate is coupled to the first data output and the second input of the logic gate is coupled to the output of the multiplexer. The device includes a delay circuit including an output and an input, where the output of the delay circuit is coupled to the first reset input, and the input of the delay circuit is coupled to the output of the logic gate. The device includes a reset circuit including first and second outputs and an input, in which the first output of the reset circuit is coupled to a reset input of the second flip-flop and the second output of the reset circuit is coupled to a reset input of the third flip-flop. The input of the reset circuit is coupled to the output of the delay circuit.

DETAILED DESCRIPTION

Figure 1:
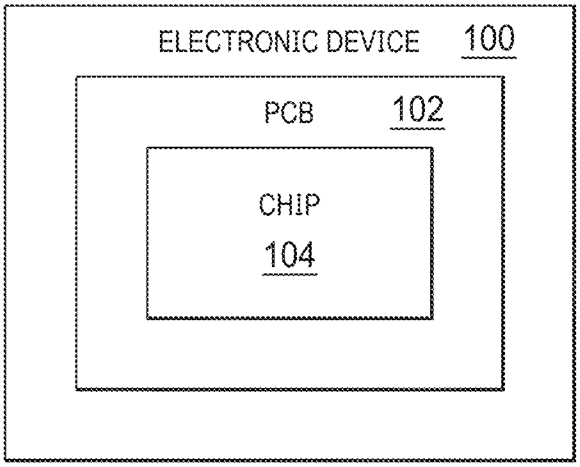
FIG. 1 is a block diagram of an electronic device including circuitry that facilitates circuit component sharing in various examples.

As described above, shared circuit components can provide significant reductions in device size and manufacturing costs. However, designing circuits in which multiple elements effectively share a single circuit component can be challenging, as different attempts to access the shared circuit component can overlap. Accordingly, the challenge is to design a circuit that can arbitrate multiple circuit elements'access to a shared circuit component without conflict or overlap. This description refers to multiple circuit elements sharing a single circuit component without conflict, as conflict-free time-sharing, or CFTS.

Achieving CFTS in the communications context is particularly difficult. For example, an Ethernet cable includes four pairs of twisted wires, with each pair of wires providing a different data channel. An Ethernet receiver may receive, amplify, and digitize data received from the four data channels. The receiver may include four different analog-to-digital converters (ADCs), with each ADC digitizing analog signals received on a different data channel. Using a single ADC shared among the four data channels is more efficient than using four separate ADCs, but the clock signals used to control access to the shared ADC are subject to drift. This clock drift results in overlapping attempts by the four data channels to access the shared ADC. Such overlap renders the receiver essentially useless.

This description presents various examples of circuitry that facilitates CFTS of a circuit component. The circuitry may be implemented in any suitable context in which a circuit component is to be shared by multiple circuit elements. For example, in the Ethernet context described above, the circuitry effectively arbitrates the four data channels'access to the shared ADC without overlap or conflict, even in the presence of clock drift. In this way, the circuitry described herein promotes device miniaturization and manufacturing cost reduction by facilitating circuit component sharing.

An example CFTS circuit includes a first D flip-flop including a first data output, a first clock input, and a first reset input. The first clock input receives a signal indicating a status of a switch that charges a first capacitor. The circuit may include a second D flip-flop including a second data output, a second clock input, and a second reset input. The second clock input receives a signal indicating whether a shared circuit component is available to the first capacitor. The circuit may include a logic gate having a logic gate output and first and second logic gate inputs. The first logic gate input is coupled to the first data output, and the second logic gate input is coupled to the second data output. The circuit may include a delay circuit having a delay circuit output and a delay circuit input. The delay circuit output is coupled to the first and second reset inputs. The delay circuit input is coupled to the logic gate output and to a switch that discharges the first capacitor by coupling the first capacitor to the shared circuit component.

FIG. 1 is a block diagram of an electronic device including circuitry that facilitates circuit component sharing in various examples. In particular, FIG. 1 depicts an electronic device 100, a printed circuit board (PCB) 102, and a chip 104 (e.g., a semiconductor package). The electronic device 100 includes the PCB 102, and the chip 104 is coupled (e.g., soldered) to the PCB 102. The chip 104 includes circuitry that facilitates circuit component sharing. For example, the circuitry facilitates CFTS of an ADC among the data channels of an Ethernet cable coupled to the electronic device 100. Examples of the electronic device 100 include an automobile, an aircraft, a watercraft, a spacecraft, a video game console, an arcade video game unit, a smartphone, an entertainment device, an appliance, a laptop computer, a desktop computer, a tablet, a notebook, or any other suitable type of electronic device or system.

Figure 2:
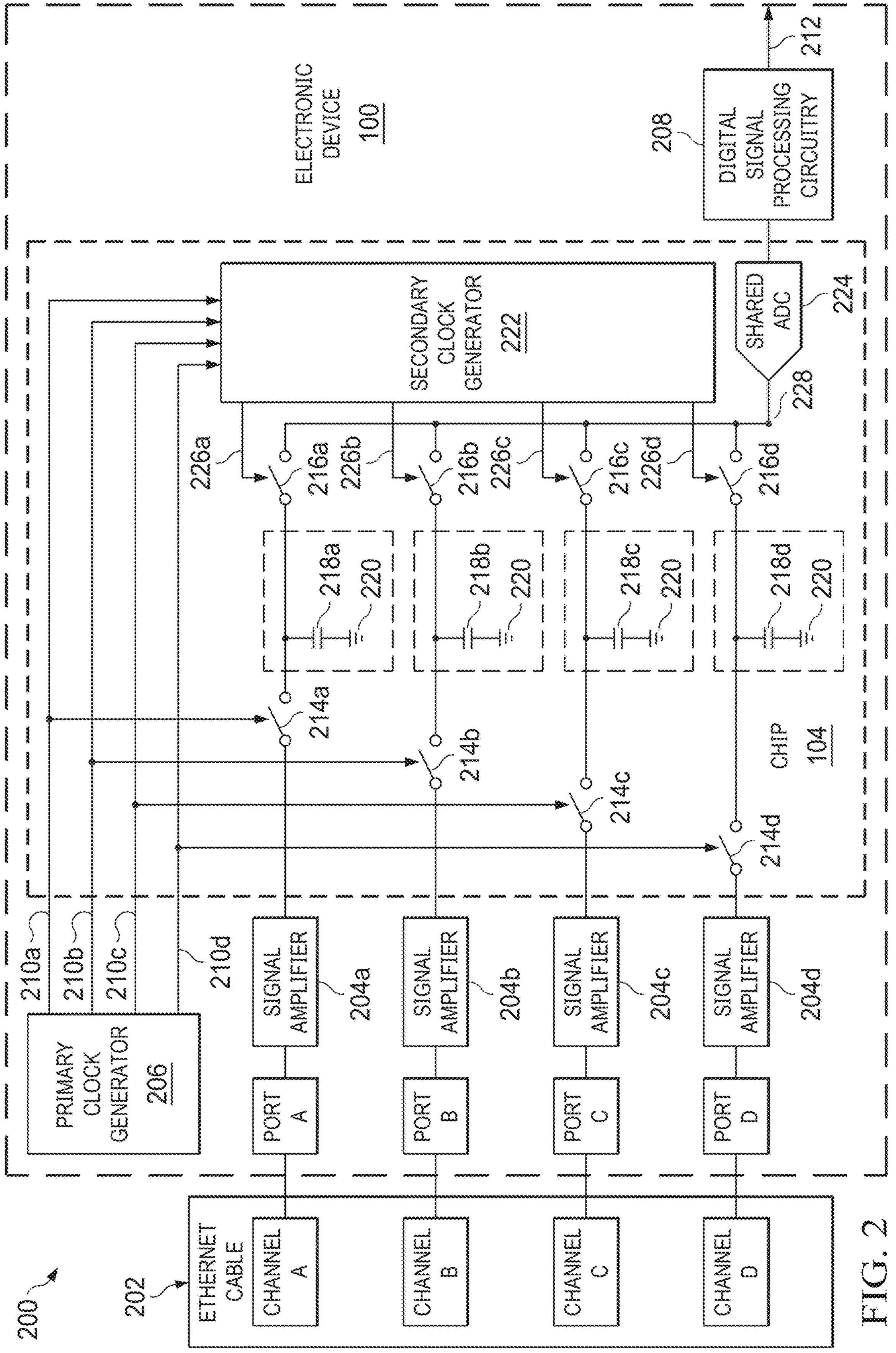
FIG. 2 is a schematic diagram of a system including circuitry that facilitates circuit component sharing in various examples.

FIG. 2 is a schematic diagram of a system 200 including circuitry that facilitates circuit component sharing in various examples. Although the system 200 may be of any suitable type, this description assumes that the system 200 is a communication system. For example, the system 200 is a Gigabit Ethernet system (e.g., 1000BASE-T defined by the IEEE 802.3ab standard) The system 200 may include an Ethernet cable 202 and the electronic device 100 (FIG. 1). The Ethernet cable 202 is coupled to the electronic device 100. The Ethernet cable 202 provides data signals from a signal source to the electronic device 100. The electronic device 100, in turn, processes the data signals using shared circuit component(s). For example, the electronic device 100 digitizes analog signals received via the Ethernet cable 202 and provide the digital signals to another device or component for subsequent use.

In examples, the Ethernet cable 202 includes multiple channels. For instance, the Ethernet cable 202 includes four channels A-D. Each of the channels A-D may include a pair of twisted wires. The wires are twisted to mitigate electromagnetic interference and crosstalk between the wires.

In examples, the electronic device 100 includes ports A-D, signal amplifiers 204*a*-204*d*, a primary clock generator 206, digital signal processing circuitry 208, and the chip 104 (FIG. 1). The ports A-D are coupled to the signal amplifiers 204*a*-204*d*, respectively. The signal amplifiers 204*a*-204*d* are coupled to the chip 104. The primary clock generator 206 is coupled to the chip 104 via connections 210*a*-210*d*. The digital signal processing circuitry 208 is coupled to the chip 104. The digital signal processing circuitry 208 includes an output 212. In operation, the ports A-D receive analog signals from the channels A-D, respectively. The ports A-D provide the analog signals to the signal amplifiers 204*a*-204*d*, respectively. The signal amplifiers 204*a*-204*d* amplify the received analog signals and provide amplified analog signals to the chip 104. The chip 104 digitizes the four amplified analog signals received from the signal amplifiers 204*a*-204*d* using a shared ADC and using clock signals received from the primary clock generator 206 via the connections 210*a*-210*d*. The chip 104 includes circuitry that arbitrates access to shared ADC by the four channels A-D in a manner that achieves CFTS of the shared ADC. The chip 104 provides the digitized signals to the digital signal processing circuitry 208 for further processing. The digital signal processing circuitry 208 may process the digitized signals received from the chip 104 and provide appropriate output signals on the output 212.

In examples, the chip 104 includes switches 214*a*-214*d* (e.g., field effect transistors (FETs), such as metal oxide semiconductor FETs (MOSFETs)) and switches 216*a*-216*d* (e.g., FETs, such as MOSFETs). Optionally, the chip 104 includes capacitors 218*a*-218*d* and ground 220 (or may include a ground terminal that couples to an electrical ground. In other examples, the capacitors 218*a*-218*d* and ground 220 are included in the electronic device 100 (e.g., on the PCB 102 of FIG. 1) but are not part of the chip 104. The chip 104 may include a secondary clock generator 222 and a shared ADC 224.

Each of the switches 214*a*-214*d* is coupled to a respective signal amplifier 204*a*-204*d*. Each of the switches 216*a*-216*d* is coupled to a respective switch 214*a*-214*d*. Also, a capacitor may be coupled between pairs of switches, in which a first terminal of the capacitor is coupled to respective terminals of a pair of switches, and a second terminal of the capacitor is coupled to ground. As shown, the capacitor 218*a* may be coupled between the switches 214*a* and 216*a*. The capacitor 218*b* may be coupled between the switches 214*b* and 216*b*. The capacitor 218*c* may be coupled between the switches 214*c* and 216*c*. The capacitor 218*d* may be coupled between the switches 214*d* and 216*d*. Each of the capacitors 218*a*-218*d* may be coupled to ground 220.

The connections 210*a*-210*d* are coupled to control terminals of the switches 214*a*-214*d*, respectively. The connections 210*a*-210*d* are also coupled to the secondary clock generator 222. The secondary clock generator 222, in turn, includes outputs 226*a*-226*d*. Each of the outputs 226*a*-226*d* is coupled to a control terminal of a respective switch 216*a*-216*d*. The shared ADC 224 includes an input 228, which is coupled to each of the switches 216*a*-216*d*. The digital signal processing circuitry 208 is coupled to the shared ADC 224.

The specific configuration of the components shown in FIG. 2 may vary. For example, some or all of the components shown in FIG. 2 are included on the chip 104. Some or all of the components shown in FIG. 2 may be included on the PCB 102, but not necessarily exclusively within the chip 104 (FIG. 1). Some or all of the components shown in FIG. 2 may be included as part of the electronic device 100. Some of the components shown in FIG. 2 may be part of the electronic device 100, while other component(s) shown in FIG. 2 may be separate from the electronic device 100. Any and all such variations and combinations are included in the scope of this description.

In some examples, a connection (e.g., 210*a*-210*d*) represents a coupling between an output of one component and an input of another component or represents a coupling between terminals of two or more different components. Moreover, arrows on the connections may represent direction of signal or data flow, e.g., from the output of one component to the input of another component. Connections without an arrow may represent or include a terminal of one or more components coupled to another component to receive a signal or data.

In operation, the primary clock generator 206 generates clock signals to operate the switches 214*a*-214*d*. The primary clock generator 206 provides these clock signals to the switches 214*a*-214*d* via the connections 210*a*-210*d*, respectively. The primary clock generator 206 also uses the connections 210*a*-210*d* to provide these clock signals to the secondary clock generator 222. The secondary clock generator 222, in turn, uses these clock signals to operate the switches 216*a*-216*d*. The primary clock generator 206 and the secondary clock generator 222 operate the switches 214*a*-214*d* and the switches 216*a*-216*d*, respectively, as follows. The switches 214*a*-214*d* are closed so as to couple each of the signal amplifiers 204*a*-204*d* to a respective capacitor 218*a*-218*d*. When a capacitor 218*a*-218*d* is coupled to a signal amplifier 204*a*-204*d*, that capacitor 218*a*-218*d* is charged. For example, the capacitor 218*a*-218*d* is charged according to the amplitude of the analog signal provided by the respective signal amplifier 204*a*-204*d*. When a switch 214*a*-214*d* is closed and the respective capacitor 218*a*-218*d* is being charged, the respective switch 216*a*-216*d* is open, so as to avoid discharging the respective capacitor 218*a*-218*d*. After the analog signal provided by a respective signal amplifier 204*a*-204*d* has been sampled and stored in a respective capacitor 218*a*-218*d*, each of the switches 214*a*-214*d* is opened.

After the capacitors 218*a*-218*d* are charged and the switches 214*a*-214*d* are opened, the switches 216*a*-216*d* cannot be closed simultaneously. If the switches 216*a*-216*d* were closed simultaneously, the shared ADC 224 would be coupled to the capacitors 218*a*-218*d* at the same time. This would render the output signals of the chip 104 unreliable. Further, the switches 216*a*-216*d* cannot be closed and opened in sequence, because the clock signals operating the switches 216*a*-216*d* are subject to drift. Eventually, this drift causes two or more of the switches 216*a*-216*d* to simultaneously access the shared ADC 224, causing the same unreliability problems described above.

Accordingly, the secondary clock generator 222 operates the switches 216*a*-216*d* in a manner that precludes competing attempts to access the shared ADC 224, even in the presence of clock drift. Specifically, and as described in detail below, the secondary clock generator 222 includes circuitry that closes each of the switches 216*a*-216*d* only when the respective switch 214*a*-214*d* is open and the remaining switches 216*a*-216*d* are open. For example, the secondary clock generator 222 closes the switch 216*a* only when the switch 214*a* is open and the switches 216*b*-216*d* are open. Similarly, the secondary clock generator 222 closes the switch 216*b* only when the switch 214*b* is open and the switches 216*a*, 216*c*, and 216*d* are open. Likewise, the secondary clock generator 222 closes the switch 216*c* only when the switch 214*c* is open and the switches 216*a*, 216*b*, and 216*d* are open. The secondary clock generator 222 closes the switch 216*d* only when the switch 214*d* is open and the switches 216*a*-216*c* are open. By closing each of the switches 216*a*-216*d* only when the above-described criteria are met, CFTS of the shared ADC 224 is preserved, even in the presence of clock drift.

When one of the switches 216*a*-216*d* is closed, the remaining switches 216*a*-216*d* are open, meaning that the capacitor 218*a*-218*d* corresponding to the closed switch 216*a*-216*d* is coupled to the shared ADC 224 and that no other capacitors 218*a*-218*d* are coupled to the shared ADC 224. The shared ADC 224 converts the analog signal from the connected capacitor 218*a*-218*d* to a digital signal. The shared ADC 224 provides the digital signal to the digital signal processing circuitry 208, which may further process the digital signal as appropriate and provide an output signal on the output 212.

Figure 3B:
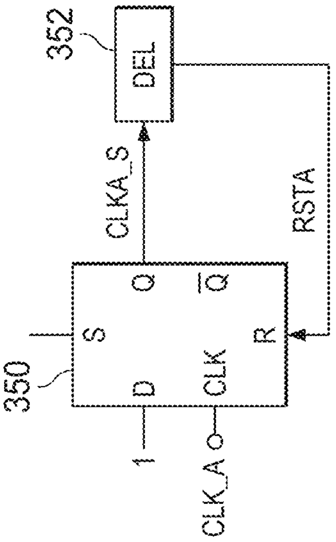
FIGS. 3A and 3B are schematic diagrams of circuitry that facilitates circuit component sharing in various examples.
Figure 3A:
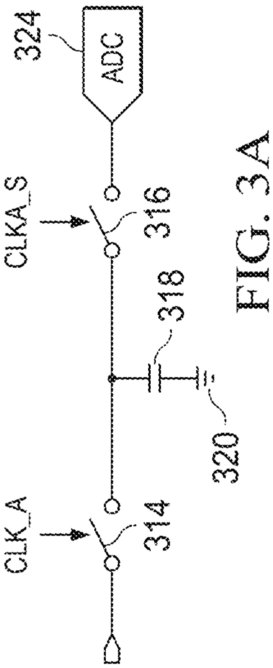
Figure 4:
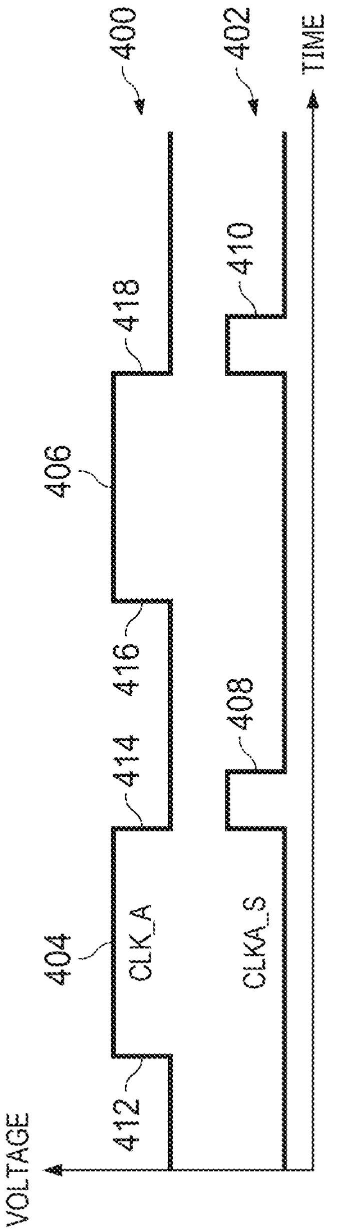
FIG. 4 is a timing diagram depicting the operation of circuitry that facilitates circuit component sharing in various examples.

FIGS. 3A and 3B are schematic diagrams of circuitry that facilitates circuit component sharing in various examples. FIG. 4 is a timing diagram depicting the operation of circuitry that facilitates circuit component sharing in various examples. The circuitry and operation depicted in FIGS. 3A, 3B, and 4 are not representative of the full scope of an example chip 104, but rather representative of the fundamental concepts underlying the circuitry and operation of the chip 104. Accordingly, before describing the circuitry within the chip 104 (and more particularly, within the secondary clock generator 222), the circuitry and operation of FIGS. 3A, 3B, and 4 are first described.

FIG. 3A depicts switches 314 and 316, a capacitor 318, ground 320, and an ADC 324. The switch 314 is coupled to a respective signal amplifier, such as signal amplifiers 204*a*-204*d* (FIG. 2). The switches 314 and 316 are coupled to each other. One terminal of the capacitor 318 is coupled between the switches 314 and 316, and the other terminal of the capacitor 318 is coupled to ground 320. The switch 316 is coupled to the ADC 324. The features and properties of the switches 314 and 316, the capacitor 318, ground 320, and the ADC 324 are similar to those of the switches 214*a*-214*d* and 216*a*-216*d*, the capacitor 218*a*-218*d*, ground 220, and the shared ADC 224 described above and thus are not repeated. A clock signal CLK_A controls the switch 314. A clock source, such as the primary clock generator 206 (FIG. 2), provides CLK_A. A clock signal CLKA_S controls the switch 316. A clock source, such as the secondary clock generator 222 (FIG. 2), provides CLKA_S.

FIG. 3B depicts an edge-triggered D flip-flop ("FF") 350 and a delay circuit 352. The FF 350 includes a D input (referred to herein as a data input or data input), a CLK input, set and reset inputs, and a Q output. The FF 350 may include other inputs and/or outputs. The D input receives a high signal that remains high (as used in reference to signals herein, the term "high" or "logic high" denotes a binary 1 and the term "low" or "logic low" denotes a binary 0). Because the input signal to the D input remains high, the D input is referred to herein as a logic high D input, or a logic high data input. Other input pins that continuously receive high input signals are also referred to herein as logic high data inputs. The CLK input receives CLK_A. The Q output provides CLKA_S to the delay circuit 352. The delay circuit 352 provides RSTA to the reset input. In examples, the CLK input is negative-edge triggered, meaning that a falling edge of a clock signal triggers the FF 350 to perform an action (e.g., capture the data input signal at the D input), but a rising edge of the clock signal does not trigger any action by the FF 350.

The various delay circuits described herein, such as the delay circuit 352, may be implemented in any suitable manner. In some examples, such delay circuits are resistor-capacitor (RC) delay circuits, in which a resistor is coupled to a capacitor that is charged via the resistor. The capacitor charge time introduces the delay. The capacitor may be sized to provide a target delay duration. In other examples, the delay circuits are inductor-capacitor (LC) delay circuits that rely on the oscillation between inductor and capacitor to provide the delay. Other types of delay circuits are contemplated and included in the scope of this description.

FIG. 4 depicts curves 400 and 402. Curve 400 includes pulses 404 and 406. Curve 402 includes pulses 408 and 410. Pulses 404 and 406 have positive (or "rising") edges 412 and 416, respectively. Pulses 404 and 406 have negative (or "falling") edges 414 and 418, respectively.

Referring to FIGS. 3A, 3B, and 4, in operation, when CLK_A rises at rising edge 412, switch 314 closes. Because FF 350 is negative-edge triggered, the rising edge 412 does not trigger the FF 350, thus keeping CLKA_S low, as curve 402 shows. Because CLKA_S is low, switch 316 remains open. Thus, with the switch 314 closed and the switch 316 open, the capacitor 318 is coupled to an analog signal source (e.g., signal amplifier 204*a* in FIG. 2), and the analog signal charges the capacitor 318.

Later, CLK_A falls at negative edge 414, as curve 400 depicts. Because FF 350 is negative-edge triggered, the negative edge 414 of CLK_A triggers FF 350 to capture the signal at the D input and provide that signal to the Q output. The signal at the D input is consistently high, as described above. Thus, CLKA_S at the Q output of the FF 350 goes high. Curve 402 depicts this change in CLKA_S with pulse 408. CLKA_S is a pulse 408 and does not remain high because of the delay circuit 352, which delays the transition of CLKA_S from low to high reaching the reset input of the FF 350. The amount of this delay determines the duration of the pulse 408. After the high CLKA_S reaches the reset input of the FF 350, the Q output of the FF 350 is again low. Thus, at the time of the pulse 408, CLK_A is low, and CLKA_S is high. Consequently, the switch 314 is open, and the switch 316 is closed, thus coupling the capacitor 318 to the ADC 324, which may be a shared ADC 324. During the pulse 408, the ADC 324 digitizes the analog signal provided by the capacitor 318 and provides the digital signal to downstream circuitry for further processing (e.g., the digital signal processing circuitry 208 in FIG. 2). After pulse 408, both CLK_A and CLKA_S are low, and thus the capacitor 318 is not being charged and is not coupled to the ADC 324. The process then repeats at rising edge 416, at which time CLK_A goes high and the switch 314 closes to charge the capacitor 318 while the switch 316 remains open. At the falling edge 418, CLK_A goes low, causing the switch 314 to open, and CLKA_S goes high, causing the switch 316 to close. CLKA_S is high only for the duration of the pulse 410, during which time the ADC 324 digitizes the signal provided by the capacitor 318. Subsequently, both CLK_A and CLKA_S are low, and thus both the switches 314 and 316 are open. This process may continue repeating.

Figure 5A:
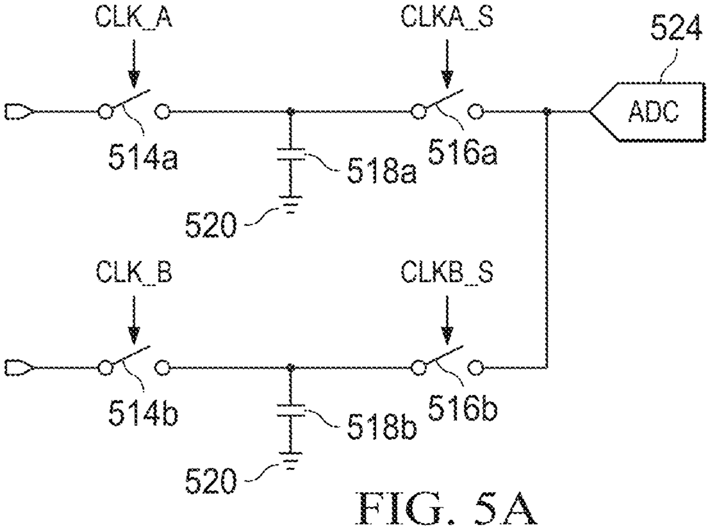
FIGS. 5A and 5B are schematic diagrams of circuitry that facilitates circuit component sharing in various examples.
Figure 5B:
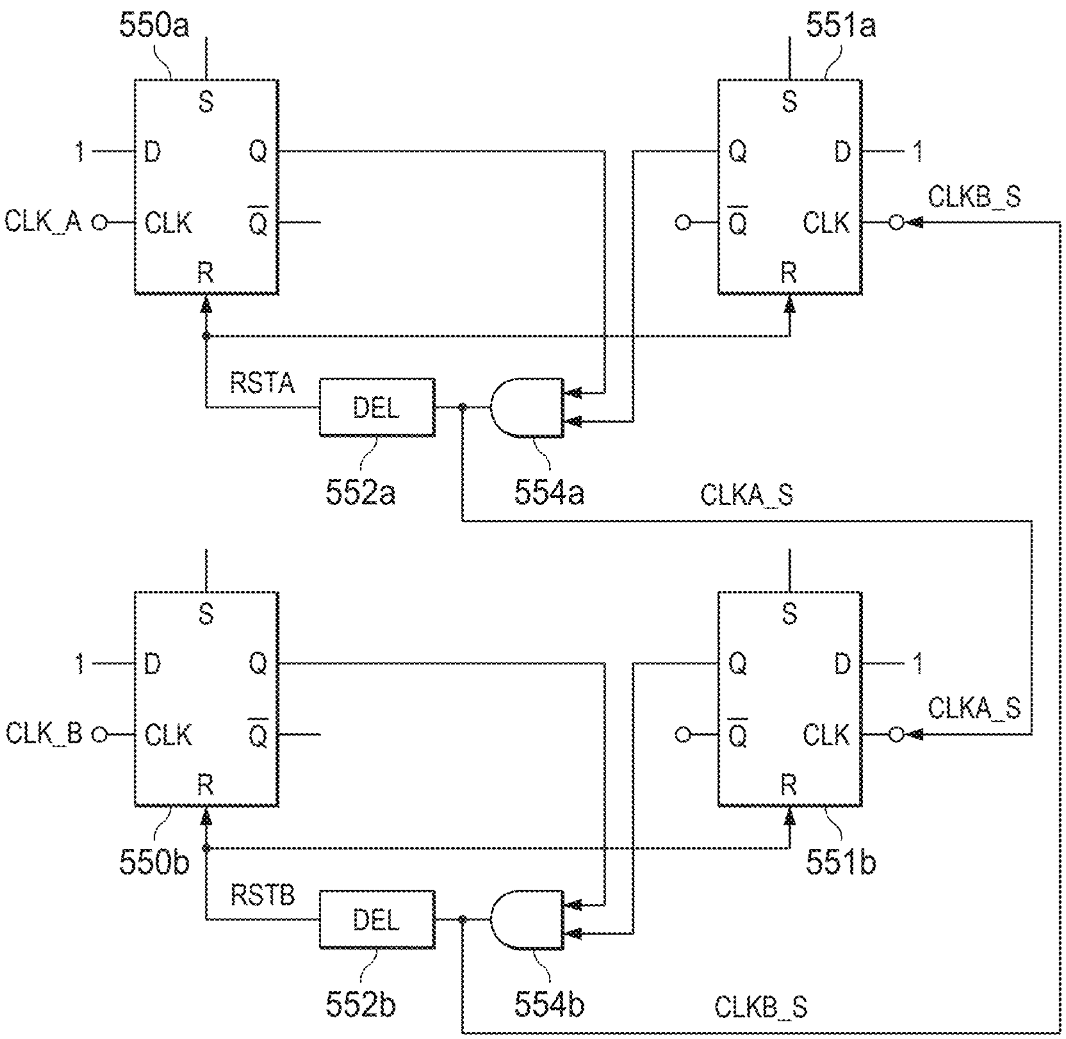
Figure 6:
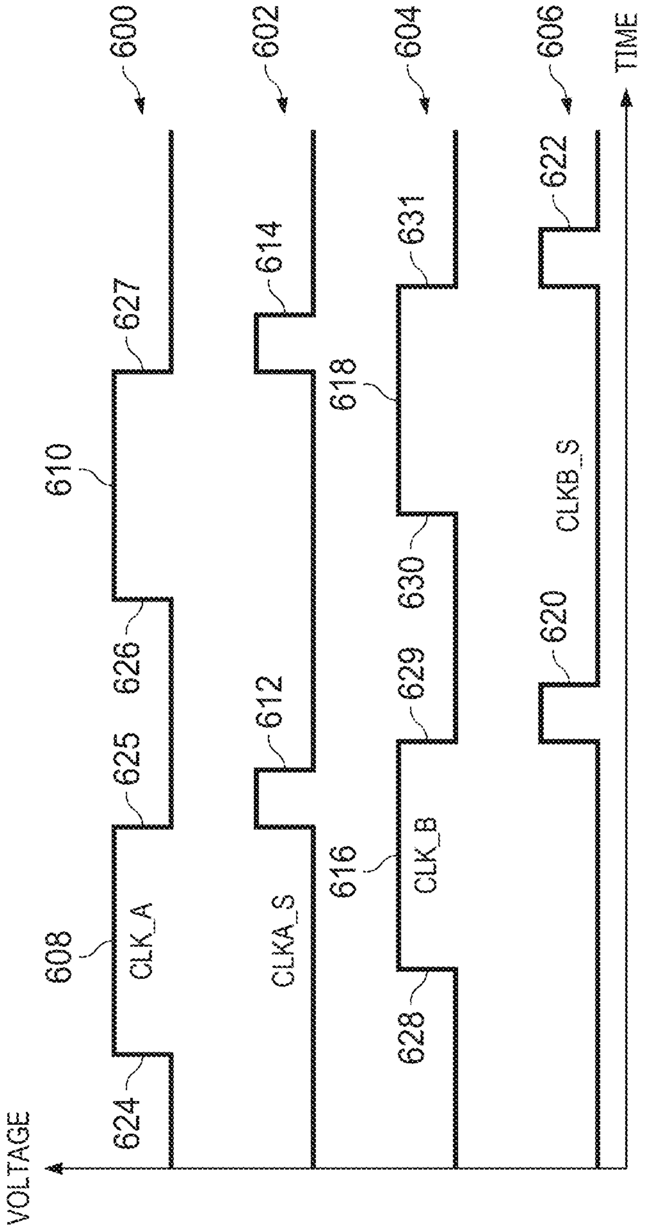
FIG. 6 is a timing diagram depicting the operation of circuitry that facilitates circuit component sharing in various examples.

FIGS. 5A and 5B are schematic diagrams of circuitry that facilitates circuit component sharing in various examples. FIG. 6 is a timing diagram depicting the operation of circuitry that facilitates circuit component sharing in various examples. The circuitry and operation depicted in FIGS. 5A, 5B, and 6 are not representative of the full scope of an example chip 104, but rather representative of the fundamental concepts underlying the circuitry and operation of the chip 104. Accordingly, before describing the circuitry within the chip 104 (and more particularly, within the secondary clock generator 222), the circuitry and operation of FIGS. 5A, 5B, and 6 are first described.

FIG. 5A depicts switches 514*a* and 516*a*, a capacitor 518*a*, ground 520, and an ADC 524. FIG. 5A also depicts switches 514*b* and 516*b* and a capacitor 518*b*. Each of the switches 514*a* and 514*b* is coupled to a respective signal amplifier, such as signal amplifiers 204*a*-204*d* (FIG. 2). The switches 514*a* and 516*a* are coupled to each other. One terminal of the capacitor 518*a* is coupled between the switches 514*a* and 516*a*, and the other terminal of the capacitor 518*a* is coupled to ground 520. The switch 516*a* is coupled to the ADC 524. The switches 514*b* and 516*b* are coupled to each other. One terminal of the capacitor 518*b* is coupled between the switches 514*b* and 516*b*, and the other terminal of the capacitor 518*b* is coupled to ground 520. The switch 516*b* is coupled to the ADC 524. The features and properties of the switches 514*a*, 514*b*, 516*a*, and 516*b*, the capacitors 518*a* and 518*b*, ground 520, and the ADC 524 are similar to those of the switches 214*a*-214*d* and 216*a*-216*d*, the capacitor 218*a*-218*d*, ground 220, and the shared ADC 224 described above and thus are not repeated. A clock signal CLK_A controls the switch 514*a*. A clock source, such as the primary clock generator 206 (FIG. 2), provides CLK_A. A clock signal CLKA_S controls the switch 516*a*. A clock source, such as the secondary clock generator 222 (FIG. 2), provides CLKA_S. A clock signal CLK_B controls the switch 514*b*. A clock source, such as the primary clock generator 206 (FIG. 2), provides CLK_B. A clock signal CLKB_S controls the switch 516*b*. A clock source, such as the secondary clock generator 222 (FIG. 2), provides CLKB_S.

FIG. 5B depicts edge-triggered D flip-flops ("FF") 550*a*, 550*b*, 551*a*, and 551*b*. Each of the FFs 550*a*-550*b* and 551-551*b* includes a D input, a CLK input, set and reset inputs, and a Q output. FIG. 5B also depicts logic gates (e.g., AND gates) 554*a* and 554*b* and delay circuits 552*a* and 552*b*. The Q output of the FF 550*a* is coupled to an input of the logic gate 554*a*, and the Q output of the FF 551*a* is coupled to an input of the logic gate 554*a*. An output of the logic gate 554*a* is coupled to an input of the delay circuit 552*a*. An output of the delay circuit 552*a* is coupled to the reset input of the FF 550*a*. The Q outputs of the FFs 550*b* and 551*b* are coupled to the inputs of the logic gate 554*b*. An output of the logic gate 554*b* is coupled to an input of the delay circuit 552*b*. An output of the delay circuit 552*b* is coupled to the reset input of the FF 550*b*. The output of the logic gate 554*a* may be coupled to the CLK input of the FF 551*b*. The output of the logic gate 554*b* may be coupled to the CLK input of the FF 551*a*.

The CLK inputs of the FFs 550*a*, 550*b*, 551*a*, and 551*b* may be negative-edge triggered and may receive clock signals CLK_A, CLK_B, CLKB_S, and CLKA_S, respectively. The D inputs of the FFs 550*a*, 550*b*, 551*a*, and 551*b* may receive continuous high signals. The signal provided by the delay circuit 552*a* to the reset input of the FF 550*a* is RSTA, and the signal provided by the delay circuit 552*b* to the reset input of the FF 550*b* is RSTB.

FIG. 6 depicts curves 600, 602, 604, and 606. Curve 600 includes pulses 608 and 610. Curve 602 includes pulses 612 and 614. Curve 604 includes pulses 616 and 618. Curve 606 includes pulses 620 and 622. The pulse 608 has a rising edge 624 and falling edge 625. The pulse 610 has a rising edge 626 and a falling edge 627. The pulse 616 has a rising edge 628 and a falling edge 629. The pulse 618 has a rising edge 630 and a falling edge 631.

The circuitry shown in FIG. 5B operates the switches of FIG. 5A to facilitate CFTS of the ADC 524 among the capacitors 518*a* and 518*b*. As described above, to achieve CFTS of the ADC 524, the switch 516*a* may be closed only when the switches 514*a* and 516*b* are open. Similarly, the switch 516*b* may be closed only when the switches 514*b* and 516*a* are open. Accordingly, as the curves in FIG. 6 depict, the pulses 612 and 614, which close the switch 516*a*, are issued only when CLK_A is low (i.e., the switch 514*a* is open) and CLKB_S is low (i.e., the switch 516*b* is open). Similarly, as the curves in FIG. 6 depict, the pulses 620 and 622, which close the switch 516*b*, are issued only when CLK_B is low (i.e., the switch 514*b* is open) and CLKA_S is low (i.e., the switch 516*a* is open). Accordingly, the manner in which the circuitry of FIG. 5B operates to achieve the clock signaling scheme of FIG. 6 is now described.

At the rising edge 624 of CLK_A, the Q output of FF 550*a* remains low. Thus, the CLKA_S output of the logic gate 554*a* is low. Because no falling edge of CLKA_S triggers the FF 551*b*, the output CLKB_S of the logic gate 554*b* also remains low. Thus, at the rising edge 624, the switch 514*a* is closed, while the switches 514*b*, 516*a*, and 516*b* remain open.

However, at the falling edge 625 of CLK_A, the FF 550*a* is triggered, capturing the high input signal at the D input and providing a high output signal at the Q output. Further, the Q output of the FF 551*a* provides a high output signal from the most recent falling edge of CLKB_S, as the FF 551*a* has not been reset since that most recent falling edge of CLKB_S. Thus, the logic gate 554*a* provides a high output signal CLKA_S. The CLK_B has gone high at rising edge 628, but because the FF 550*b* may be negative-edge triggered, the logic gate 554*b* provides a low CLKB_S. Thus, at falling edge 625, CLK_A opens the switch 514*a*, CLKA_S closes the switch 516*a*, CLK_B maintains the switch 514*b* in a closed state to charge the capacitor 518*b*, and CLKB_S is low, keeping the switch 516*b* open. Stated another way, when CLKA_S rises to close the switch 516*a*, the switches 514*a* and 516*b* are open, thus preventing the possibility of competing simultaneous attempts to access the shared ADC 524. The delay circuit 552*a* provides a short delay before the high signal CLKA_S resets the FF 550*a*, which causes the Q output of 550*a* to provide a low output signal and the output signal provided on the output of the logic gate 554*a* to fall. In this way, the pulse 612 is formed. The pulse 612 closes the switch 516*a* for a time period during which the capacitor 518*a* is discharged to the shared ADC 524. The pulse 612 also resets both of the FFs 550*a* and 551*a*.

After the capacitor 518*a* has the opportunity to access the shared ADC 524, it is the turn of capacitor 518*b* to access the shared ADC 524. To couple the capacitor 518*b* to the shared ADC 524, the switch 516*b* may close. However, as described above, to prevent competing attempts to access the shared ADC 524, the switch 516*b* may close only when the switch 516*a* is open. Further, as described, to prevent the simultaneous charging and discharging of the capacitor 518*b*, the switch 516*b* may close only when the switch 514*b* is open. The circuitry of FIG. 5B facilitates the switch 516*b* closing only when the switches 516*a* and 514*b* are open by producing the pulse 620 after the CLKA_S pulse 612 has gone low, thus triggering the FF 551*b* to provide a high output signal on the Q output, and after CLK_B has gone low at falling edge 629, thus triggering the FF 550*b* to provide a high output signal on the Q output. As a result of receiving two high output signals on the Q outputs, the logic gate 554*b* provides a high CLKB_S (pulse 620), which closes the switch 516*b*. The delay circuit 552*b* causes the pulse 620 to form, as described above. The pulse 620 also resets both of the FFs 550*b* and 551*b*.

The operation of the circuitry of FIG. 5B facilitates CFTS of the shared ADC 524 even in the presence of clock drift because the circuitry does not rely on continuous clock accuracy. Rather, the circuitry of FIG. 5B couples the capacitor 518*a* to the shared ADC 524 only after the capacitor 518*b* has had a turn to couple to the shared ADC 524 and when the switch 514*a* is open. Similarly, the circuitry of FIG. 5B couples the capacitor 518*b* to the shared ADC 524 only after the capacitor 518*a* has had a turn to couple to the shared ADC 524 and when the switch 514*b* is open. Stated another way, the circuitry follows a sequence in which the capacitors 518*a*, 518*b* take turns accessing the shared ADC 524 and relies on switch state to determine when it is appropriate to connect a capacitor 518*a*, 518*b* to the shared ADC 524. Thus, even if the clocks CLK_A, CLKA_S, CLK_B, and/or CLKB_S were to drift over time, the circuitry would still facilitate CFTS of the shared ADC 524.

Figure 7:
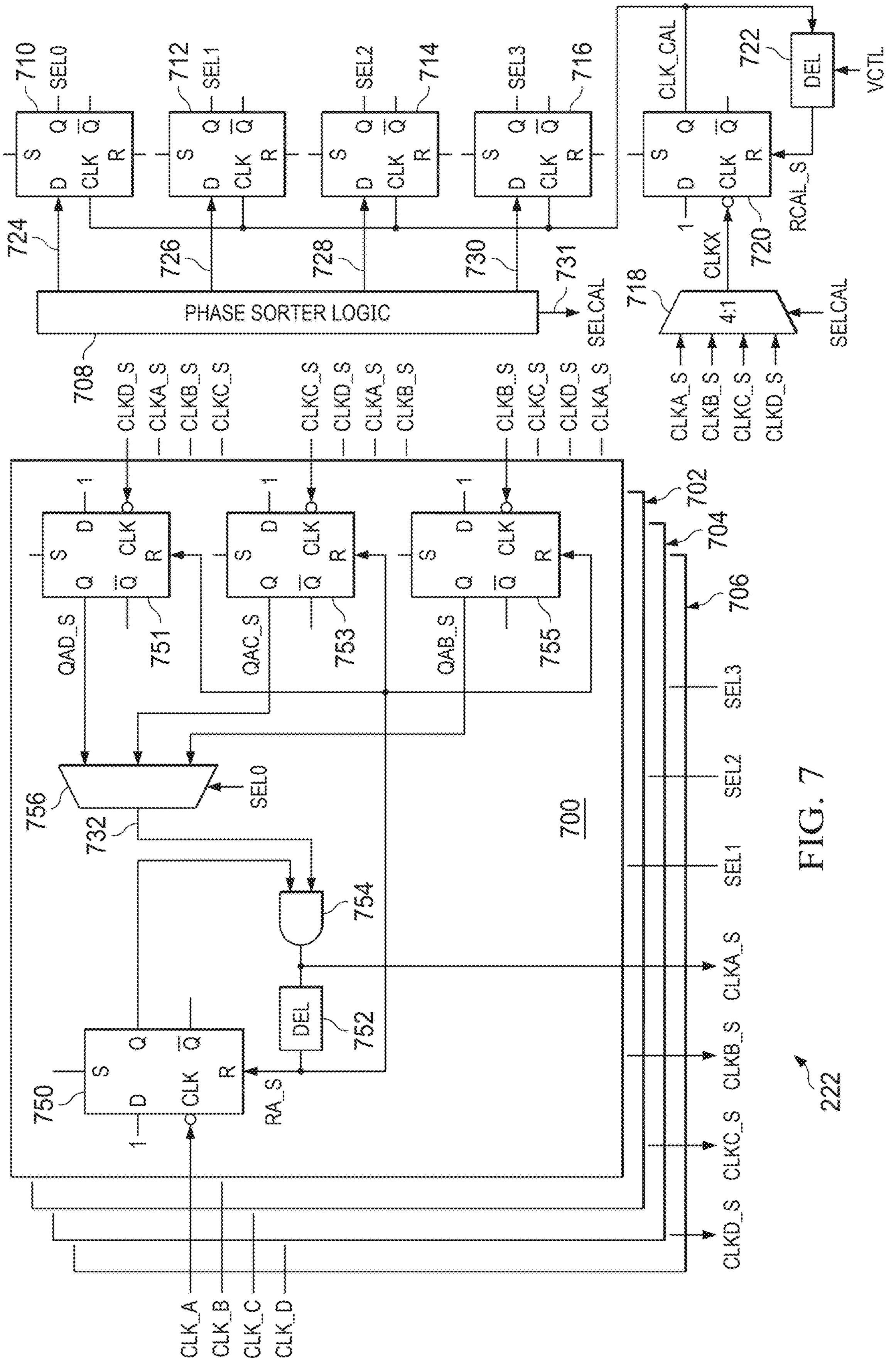
FIG. 7 is a schematic diagram of circuitry that facilitates circuit component sharing in various examples.

The circuitry of FIG. 5B implements fundamental concepts that can be extended to accommodate additional switches, such as in the case of Ethernet systems, which may require four switches (FIG. 2). FIG. 7 is a schematic diagram of circuitry that facilitates circuit component sharing among multiple circuit elements in various examples. Because the circuitry of FIG. 7 generates the clock signals CLKA_S, CLKB_S, CLKC_S, and CLKD_S, the circuitry is said to generate secondary clock signals, and thus is an example of the secondary clock generator 222 (FIG. 2).

The example secondary clock generator 222 includes four instances of circuitry 700, 702, 704, and 706, also referred to as output clock generator circuitry and each of which produces a different one of the secondary clock signals CLKA_S, CLKB_S, CLKC_S, and CLKD_S. The secondary clock generator 222 may further include phase sorter logic 708 (e.g., a processor or microcontroller), D flip-flops (FFs) 710, 712, 714, and 716, a multiplexer 718, a D flip-flop (FF) 720, and a delay circuit 722.

In examples, the instance of circuitry 700 includes a D flip-flop 750, D flip-flops 751, 753, and 755, a delay circuit 752, a logic gate 754 (e.g., an AND gate), and a multiplexer 756. Each of the FFs 750, 751, 753, and 755 may include a negative-edge triggered CLK input, a D input, set and reset inputs, and a Q output. The CLK input of FF 750 may be coupled to a clock source that provides CLK_A, such as the primary clock generator 206 via the connection 210*a* (FIG. 2). The D input of FF 750 continuously receives a high signal. The Q output of FF 750 is coupled to an input of the logic gate 754. The CLK input of FF 751 may be coupled to the instance of circuitry 706 that generates CLKD_S. The D input of FF 751 continuously receives a high signal. The Q output of FF 751 is coupled to an input of the multiplexer 756. The CLK input of FF 753 may be coupled to the instance of circuitry 704 that generates CLKC_S. The D input of FF 753 continuously receives a high signal. The Q output of FF 753 is coupled to an input of the multiplexer 756. The CLK input of FF 755 may be coupled to the instance of circuitry 702 that generates CLKB_S. The D input of FF 755 continuously receives a high signal. The Q output of FF 755 is coupled to an input of the multiplexer 756. The multiplexer 756 receives a control signal SEL0. An output 732 of the multiplexer 756 is coupled to an input of the logic gate 754. An output of the logic gate 754 is coupled to an input of the delay circuit 752. An output of the delay circuit 752 is coupled to the reset inputs of the FFs 750, 751, 753, and 755.

Each of the instances of circuitry 700, 702, 704, and 706 includes identical or virtually identical hardware, although the signals provided to each instance of circuitry may vary. The instances of circuitry 702, 704, and 706 have virtually identical hardware and similar operation as the instance of circuitry 700. For example, the instances of circuitry 702, 704, and 706 include negative-edge triggered D flip-flops similar to FF 750 that receive CLK_B, CLK_C, and CLK_D signals as input signals, respectively. Similarly, the instances of circuitry 702, 704, and 706 may include negative-edge triggered D flip-flops similar to FF 751 that receive CLKA_S, CLKB_S, and CLKC_S, respectively. The instances of circuitry 702, 704, and 706 may include negative-edge triggered D flip-flops similar to FF 753 that receive CLKD_S, CLKA_S, and CLKB_S, respectively. The instances of circuitry 702, 704, and 706 may include negative-edge triggered D flip-flops similar to FF 755 that receive CLKC_S, CLKD_S, and CLKA_S, respectively. Each of the instances of circuitry 702, 704, and 706 may include a multiplexer similar to the multiplexer 756 that couples to the Q outputs of the FFs in that instance of circuitry that correspond to the FFs 751, 753, and 755 in the instance of circuitry 700. Each of the instances of circuitry 702, 704, and 706 includes a logic gate similar to the logic gate 754 in the instance of circuitry 700, with similar connections to other components in that instance of circuitry. Each of the instances of circuitry 702, 704, and 706 includes a delay circuit similar to the delay circuit 752 in the instance of circuitry 700. The various components in each of the instances of circuitry 702, 704, and 706 may couple to each other in the same or identical manner as do the components in the instance of circuitry 700.

The phase sorter logic 708 includes outputs 724, 726, 728, and 730. The FFs 710, 712, 714, and 716 include D inputs, positive-edge triggered CLK inputs, set and reset inputs, and Q outputs. The output 724 is coupled to the D input of FF 710. The output 726 is coupled to the D input of FF 712. The output 728 is coupled to the D input of FF 714. The output 730 is coupled to the D input of FF 716. The Q output of each of the FFs 710, 712, 714, and 716 is coupled to the multiplexer of the instances of circuitry 700, 702, 704, and 706, respectively. For example, the Q output of the FF 710 is coupled to the control input of the multiplexer 756. Similarly, the Q output of the FF 712 is coupled to the control input of the multiplexer in the instance of circuitry 702 that corresponds to the multiplexer 756. The Q output of the FF 714 is coupled to the control input of the multiplexer in the instance of circuitry 704 that corresponds to the multiplexer 756. The Q output of the FF 716 is coupled to the control input of the multiplexer in the instance of circuitry 706 that corresponds to the multiplexer 756.

The multiplexer 718 may include a first input that is coupled to the output of the logic gate 754. The multiplexer 718 may include a second input that is coupled to the output of the logic gate in the instance of circuitry 702 that corresponds to the logic gate 754. The multiplexer 718 may include a third input that is coupled to the output of the logic gate in the instance of circuitry 704 that corresponds to the logic gate 754. The multiplexer 718 may include a fourth input that is coupled to the output of the logic gate in the instance of circuitry 706 that corresponds to the logic gate 754. The phase sorter logic 708 includes an output 731 that is coupled to a control input of the multiplexer 718. The phase sorter logic 708 provides a signal SELCAL on the output 731.

The FF 720 includes a negative-edge triggered CLK input, a D input, set and reset inputs, and a Q output. The CLK input is coupled to an output of the multiplexer 718. The D input continuously receives a high signal. The Q output is coupled to an input of the delay circuit 722. An output of the delay circuit 722 is coupled to the reset input of the FF 720. The Q output of the FF 720 is also coupled to the CLK inputs of the FFs 710, 712, 714, and 716.

In operation, each of the instances of circuitry 700, 702, 704, and 706 receives a different primary clock signal from the primary clock generator 206 (FIG. 2) via the connections 210*a*-210*d* (FIG. 2) and provides a different secondary clock signal to the switches 216*a*, 216*b*, 216*c*, and 216*d* as output signals. For example, the instance of circuitry 700 receives CLK_A as an input signal from the primary clock generator 206 and provide CLKA_S as an output signal to the switch 216*a*. Similarly, the instance of circuitry 702 may receive CLK_B as an input signal from the primary clock generator 206 and provide CLKB_S as an output signal to the switch 216*b*. The instance of circuitry 704 may receive CLK_C as an input signal from the primary clock generator 206 and provide CLKC_S as an output signal to the switch 216*c*. The instance of circuitry 706 may receive CLK_D as an input signal from the primary clock generator 206 and provide CLKD_S as an output signal to the switch 216*d*. In this way, the primary clock generator 206 and the secondary clock generator 222 work together to operate the switches 214*a*-214*d* and 216*a*-216*d* (FIG. 2) so as to facilitate CFTS of the shared ADC 224.

Referring to the instance of circuitry 700, the FF 750 operates to keep CLKA_S low (i.e., switch 216*a* is not closed) unless CLK_A is low (i.e., switch 214*a* is open). The FFs 751, 753, and 755 and the multiplexer 756 operate to keep CLKA_S low (i.e., switch 216*a* is not closed) unless CLKB_S, CLKC_S, and CLKD_S are low (i.e., the switches 216*b*-216*d* are open). The logic gate 754 generates a high CLKA_S only when the foregoing conditions are true. Accordingly, when CLK_A goes low, the falling edge of CLK_A triggers the FF 750 to capture the high D input and to provide a high output signal on the Q output. This Q output provides the high output signal until the FF 750 is reset. Further, when CLKD_S goes low, the falling edge triggers the FF 751 to capture the high input signal on the D input and to provide a high output signal on the Q output. This high output signal on the Q output is provided as an input signal to the multiplexer 756 and remains high until the FF 751 is reset. When CLKC_S goes low, the falling edge triggers the FF 753 to capture the high input signal on the D input and to provide a high output signal on the Q output. This high output signal on the Q output is provided as an input signal to the multiplexer 756 and remains high until the FF 753 is reset. When CLKB_S goes low, the falling edge triggers the FF 755 to capture the high input signal on the D input and to provide a high output signal on the Q output. This high output signal on the Q output is provided as an input signal to the multiplexer 756 and remains high until the FF 755 is reset.

Although high output signals on the Q outputs of the FFs 751, 753, and 755 are available to the multiplexer 756, the high Q output that is pertinent to whether a CLKA_S pulse can be generated to close the switch 216*a* is dependent upon the sequence that is programmed into the phase sorter logic 708. For example, if the phase sorter logic 708 is programmed with a sequence A, B, C, D, the CLKA_S pulse is scheduled to be generated first, followed by the CLKB_S pulse, followed by the CLKC_S pulse, followed by the CLKD_S pulse. Thus, in determining whether a particular secondary clock signal pulse can be generated without causing competing attempts to access the shared ADC 224 (FIG. 2), the multiplexer 756 may determine whether the previous secondary clock signal in the sequence has provided a pulse. For example, in the case of CLKA_S and assuming a sequence of A, B, C, D, the phase sorter logic 708 sets the signal SEL0 to cause the multiplexer 756 to provide on the output 732 the output signal of the Q output of FF 751, because the output signal on the Q output of FF 751 indicates whether a falling edge of CLKD_S has been detected. Similarly, in the case of CLKB_S and assuming a sequence of A, B, C, D, the multiplexer in the instance of circuitry 702 receives control signal SEL1 and provide the output signal of the Q output of the FF that indicates a falling edge of CLKA_S has been detected. Likewise, in the case of CLKC_S and assuming a sequence of A, B, C, D, the multiplexer in the instance of circuitry 704 receives control signal SEL2 and provides the output signal of the Q output of the FF that indicates a falling edge of CLKB_S has been detected. In the case of CLKD_S and assuming the same sequence of A, B, C, D, the multiplexer in the instance of circuitry 706 receives control signal SEL3 and provide the output signal of the Q output of the FF that indicates a falling edge of CLKC_S has been detected. Thus, in the instance of circuitry 700, a high CLKA_S output signal of the logic gate 754 indicates that CLK_A is low and that CLKD_S has finished its pulse. Accordingly, the CLKA_S pulse does not cause competing attempts to access the shared ADC 224. During the CLKA_S pulse, only the capacitor 218*a* is coupled to the shared ADC 224, and the remaining capacitors 218*b*-218*d* is decoupled from the shared ADC 224. The same is true for CLKB_S, CLKC_S, and CLKD_S.

The phase sorter logic 708 may be programmed with the sequence of the secondary clock signals. For example, the phase sorter logic 708 is programmed with the sequence A, B, C, D. The phase sorter logic 708 provides signals on the outputs 724, 726, 728, and 730 to the D inputs of the FFs 710, 712, 714, and 716, respectively, responsive to the programmed sequence. The CLK inputs to the FFs 710, 712, 714, and 716 receive a rising edge trigger that causes the FFs 710, 712, 714, and 716 to capture the signals provided on the respective D inputs and to provide the signals as Q output signals SEL0, SEL1, SEL2, and SEL3, respectively. Thus, if the sequence is A, B, C, D, then SEL0 has a digital value that causes the multiplexer 756 to output CLKD_S, SEL1 has a digital value that causes the multiplexer of the instance of circuitry 702 to output CLKA_S, SEL2 has a digital value that causes the multiplexer of the instance of circuitry 704 to output CLKB_S, and SEL3 has a digital value that causes the multiplexer of the instance of circuitry 706 to output CLKC_S. In some examples, each of SEL0-SEL3 is multiple bits in length, and in such examples, the FFs 710, 712, 714, and 716 are multi-bit D flip-flops with multi-bit D inputs and multi-bit Q outputs.

In some examples, the above-described sequence is programmed in the phase sorter logic 708. In other examples, the phase sorter logic 708 dynamically determines the sequence responsive to the primary clock signals CLK_A, CLK_B, CLK_C, and CLK_D received on the connections 210*a*-210*d*, respectively (FIG. 2). Any clock drift that occurs is accounted for as the phase sorter logic 708 monitors the primary clock signals. In this manner, the phase sorter logic 708 continuously monitors the sequence of the primary clock signals and adjust the control signals SEL0-SEL3 accordingly.

The multiplexer 718, FF 720, and delay circuit 722 determine when the FFs 710, 712, 714, and 716 capture new sequences from the phase sorter logic 708. The phase sorter logic 708 provides the control signal SELCAL on the output 731 responsive to the identity of the last clock signal in the most recent sequence output by the phase sorter logic 708. For example, if the phase sorter logic 708 most recently output a sequence A, B, C, D, then the phase sorter logic 708 provides a SELCAL signal that indicates the secondary clock signal CLKD_S, since "D" is the last element in the sequence. Accordingly, the multiplexer 718 provides CLKD_S as an output signal. Because the multiplexer output is coupled to a negative-edge triggered CLK input of FF 720, the FF 720 is triggered at the falling edge of CLKD_S. Stated another way, the FF 720 is triggered when all of the switches 216*a*-216*d* have been closed and opened according to the sequence most recently output by the phase sorter logic 708. When the FF 720 is triggered, the FF 720 captures the high input signal on the D input and provides a high output signal on the Q output. The high output signal on the Q output triggers the FFs 710, 712, 714, and 716, causing these FFs to capture the newest sequence being provided by the phase sorter logic 708. Thus, the secondary clock generator 222 adapts to sequence changes due to clock drift.

In this way, the primary clock generator 206 operates the switches 214*a*-214*d* and the secondary clock generator 222 operates the switches 216*a*-216*d* to facilitate CFTS of the shared ADC 224.

In some cases, it is possible for FFs 751, 753, and 755 to capture and store data after these FFs are reset but before these FFs are used again. For example, when the instance of circuitry 700 generates CLKA_S, the FFs 750, 751, 753, and 755 are reset. The instances of circuitry 702, 704, and 706 may then proceed to generate CLKB_S, CLKC_S, and CLKD_S. During that time, the instance of circuitry 700 is still active, and the FFs 751, 753, and 755 may still receive and capture data as these FFs are triggered by their respective CLK inputs. This data stored in the FFs 751, 753, and 755 is not stored and can result in operational failure. The same is true for FFs in the instances of circuitry 702, 704, and 706.

Figure 8:
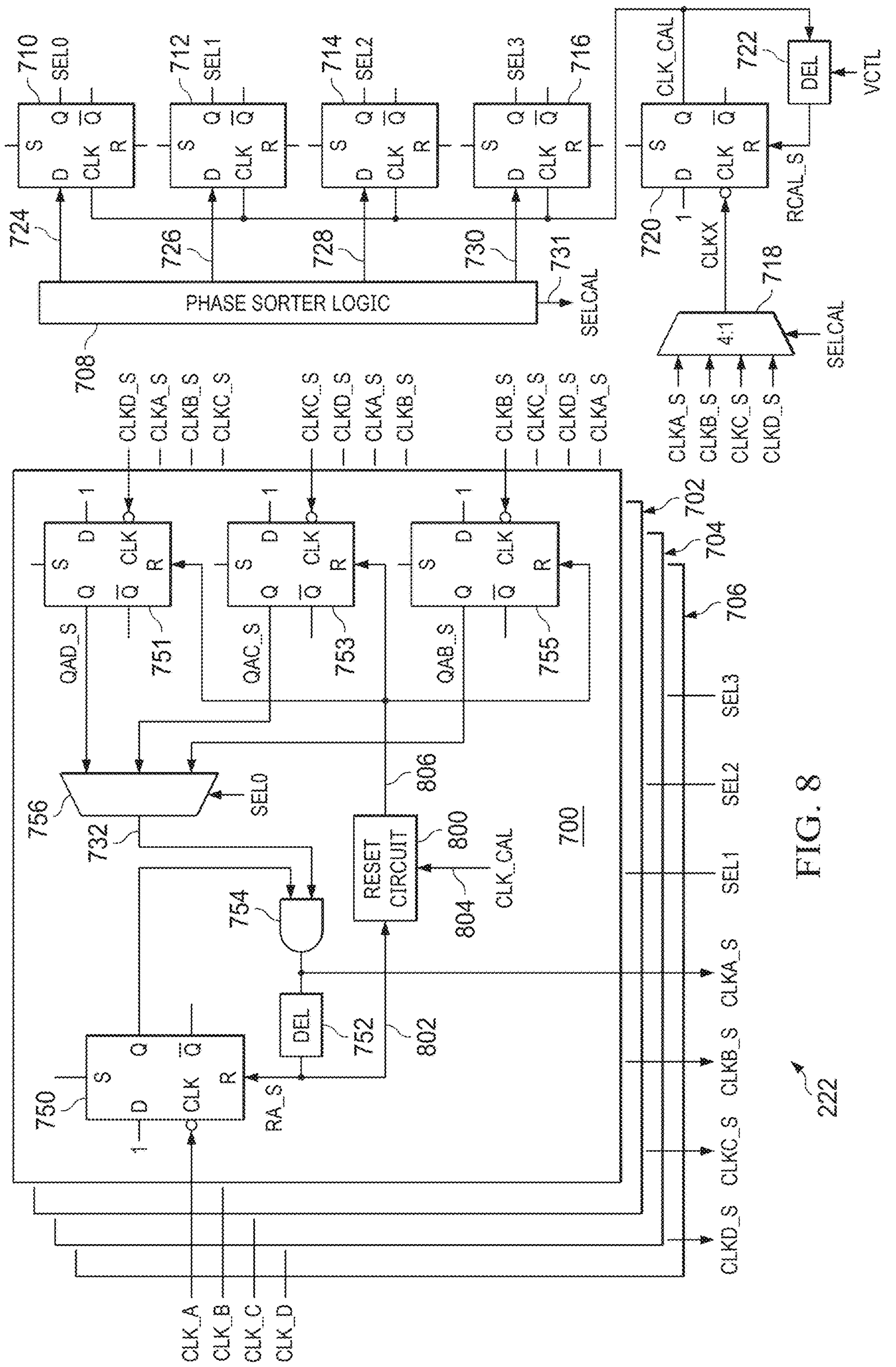
FIG. 8 is a schematic diagram of circuitry that facilitates circuit component sharing in various examples.

To prevent data from being stored in the FFs of a particular instance of circuitry 700, 702, 704, and 706 when that particular instance of circuitry is not being used to generate a secondary clock signal CLKA_S, CLKB_S, CLKC_S, or CLKD_S, a circuit may maintain the FFs in a reset state until the sequence of the phase sorter logic 708 is complete. FIG. 8 depicts an example secondary clock generator 222 containing such a circuit. In particular, the example secondary clock generator 222 of FIG. 8 includes a reset circuit 800 having inputs 802, 804 and an output 806. The input 802 is coupled to the output of the delay circuit 752. The input 804 is coupled to the Q output of the FF 720. The output 806 is coupled to the reset inputs of the FFs 751, 753, and 755. The reset circuit 800 includes, for example, an SR latch, with the set input S being the input 802, and the reset input R being the input 804. Responsive to a pulse CLKA_S being generated by the logic gate 754, the FF 750 is reset, and the reset circuit 800 receives a high signal on the input 802 (the set input of the SR latch). Because the sequence of the phase sorter logic 708 is not yet complete, CLK_CAL is low, and thus the input 804 (the reset input of the SR latch) is low. Thus, the reset circuit 800 (the SR latch)

provides a high signal on the output 806, which causes the FFs 751, 753, and 755 to be reset. The output 806 provides the high signal until the sequence of the phase sorter logic 708 is complete, and thus the FFs 751, 753, and 755 remain in a reset state. Because the FFs 751, 753, and 755 are in a reset state, these FFs cannot capture data, and the risk to the operational integrity of these FFs is mitigated. When the sequence of the phase sorter logic 708 is complete, CLK-_CAL rises as described above, thus causing the SR latch to be reset. Thus, the reset circuit 800 may provide a low signal on the output 806, causing the FFs 751, 753, and 755 to exit the reset state and to again be available to store data. Each of the instances of circuitry 702, 704, and 706 may include reset circuits that operate similarly to the reset circuit 800.

Figure 9:
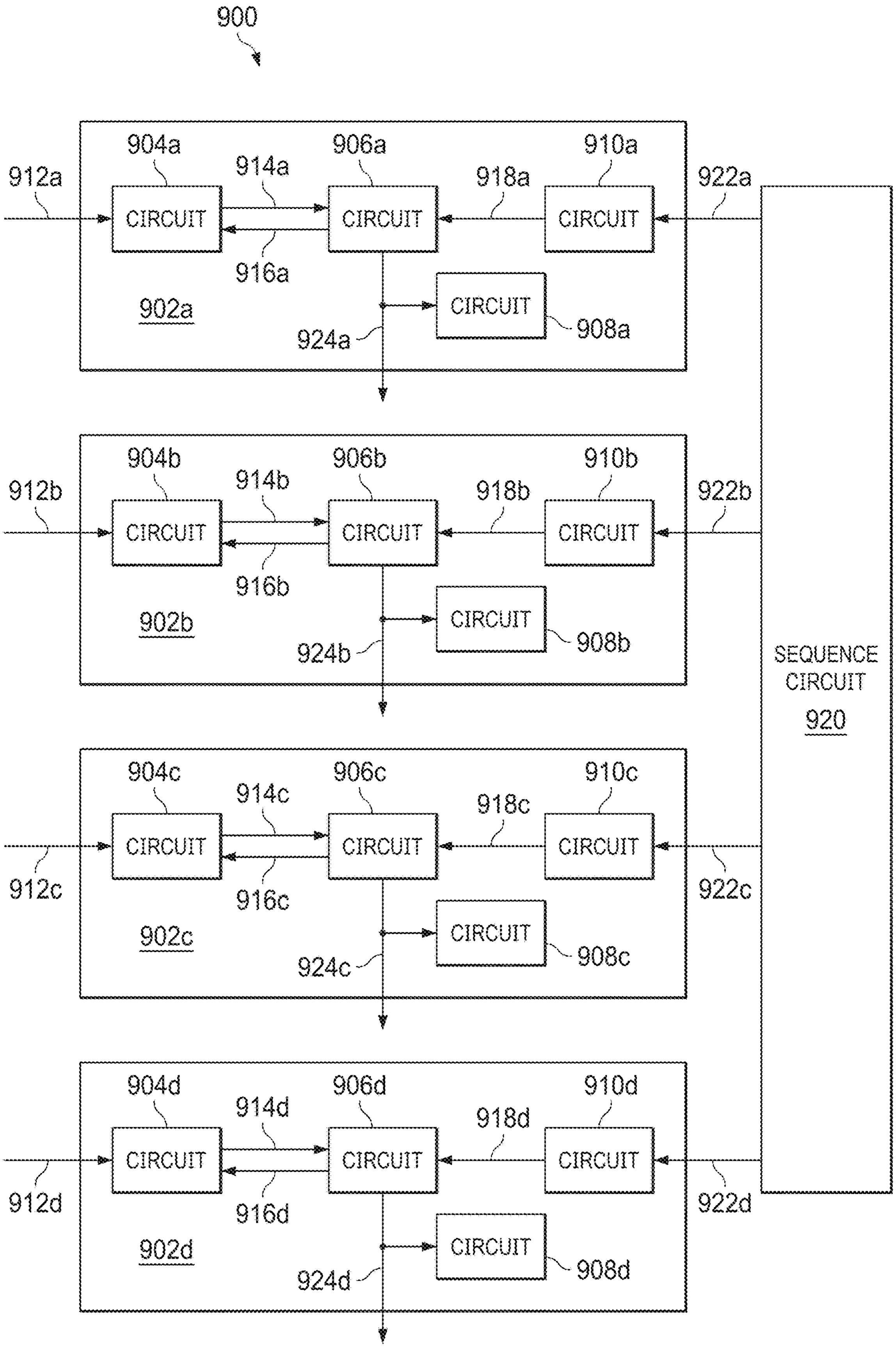
FIG. 9 is a block diagram of circuitry that facilitates circuit component sharing in various examples.

FIG. 9 is a block diagram of circuitry that facilitates circuit component sharing in various examples. In particular, FIG. 9 depicts a secondary clock generator 900 that is a genericized version of the secondary clock generator 222 of FIG. 8. The secondary clock generator 900 may include four instances of circuitry 902*a*-902*d*. The four instances of circuitry 902*a*-902*d* may include circuits 904*a*-904*d*, circuits 906*a*-906*d*, circuits 908*a*-908*d*, and circuits 910*a*-910*d*. The circuits 904*a*-904*d* include inputs 912*a*-912*d* and outputs 914*a*-914*d*. The circuits 906*a*-906*d* include outputs 916*a*-916*d*. Circuits 910*a*-910*d* include outputs 918*a*-918*d*. The secondary clock generator 900 may include a sequence circuit 920. The sequence circuit 920 may include outputs 922*a*-922*d*. The outputs 914*a*-914*d* are provided to the circuits 906*a*-906*d*, respectively. The outputs 916*a*-916*d* are provided to the circuits 904*a*-904*d*, respectively. The outputs 918*a*-918*d* are provided to the circuits 906*a*-906*d*, respectively. The outputs 922*a*-922*d* are provided to the circuits 910*a*-910*d*, respectively. The circuits 906*a*-906*d* provide outputs 924*a*-924*d*, respectively.

Referring to FIGS. 8 and 9, the FF 750 is an example of the circuit 904*a*. The delay circuit 752 and the logic gate 754 are examples of circuitry that are included in the circuit 906*a*. The reset circuit 800 is an example of the circuit 908*a*. The FFs 751, 753, and 755 and the multiplexer 756 are examples of circuitry that are included in the circuit 910*a*. The phase sorter logic 708, the FFs 710, 712, 714, and 716, the multiplexer 718, the FF 720, and the delay circuit 722 are examples of circuitry that are included in the sequence circuit 920.

The circuit 904*a* performs at least those actions attributed herein to the FF 750. The circuit 906*a* performs at least those actions attributed herein to the delay circuit 752 and the logic gate 754. The circuit 908*a* performs at least those actions attributed herein to the reset circuit 800. The circuit 910*a* performs at least those actions attributed herein to the FFs 751, 753, and 755 and the multiplexer 756. The sequence circuit 920 performs at least those actions attributed herein to the phase sorter logic 708, the FFs 710, 712, 714, and 716, the multiplexer 718, the FF 720, and the delay circuit 722. The circuits 904*b*, 906*b*, 908*b*, and 910*b* in the instance of circuitry 902*b* include components similar to those included in the circuits 904*a*, 906*a*, 908*a*, and 910*a*, respectively. The operation of the instance of circuitry 902*b* is similar to that of the instance of circuitry 902*a* and of the instance of circuitry 702, and thus is not repeated. The circuits 904*c*, 906*c*, 908*c*, and 910*c* in the instance of circuitry 902*c* include components similar to those included in the circuits 904*a*, 906*a*, 908*a*, and 910*a*, respectively. The operation of the instance of circuitry 902*c* is similar to that of the instance of circuitry 902*a* and of the instance of circuitry 702, and thus is not repeated. The circuits 904*d*, 906*d*, 908*d*, and 910*d* in the instance of circuitry 902*d* include components similar to those included in the circuits 904*a*, 906*a*, 908*a*, and 910*a*, respectively. The operation of the instance of circuitry 902*d* is similar to that of the instance of circuitry 902*a* and of the instance of circuitry 702, and thus is not repeated.

Figure 10:
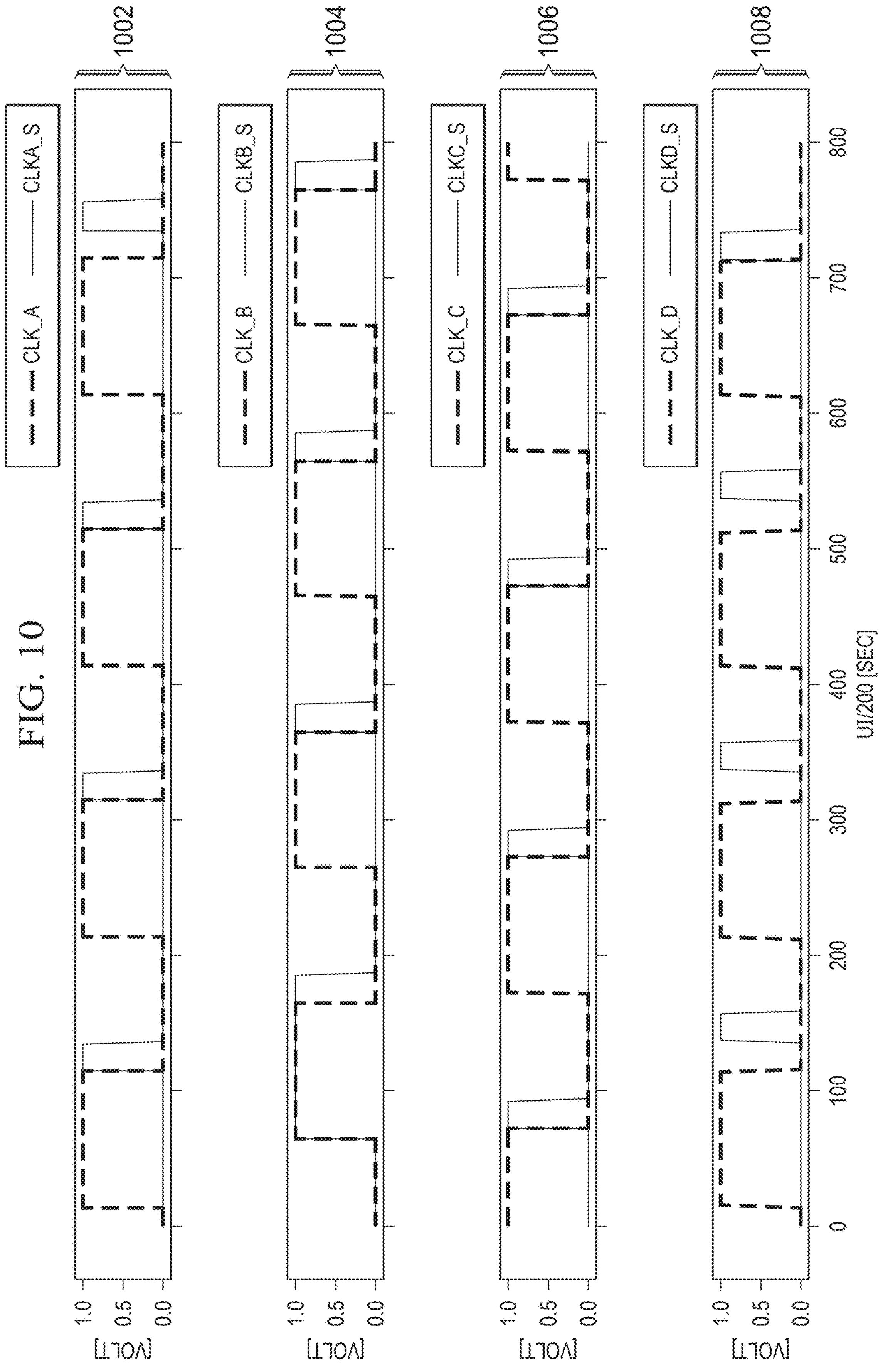
FIG. 10 is a timing diagram depicting the operation of circuitry that facilitates circuit component sharing in various examples.

FIG. 10 is a timing diagram depicting the operation of circuitry that facilitates circuit component sharing in various examples. The timing diagram includes plots 1002, 1004, 1006, and 1008. Each of the plots 1002, 1004, 1006, and 1008 includes time (unit intervals (UI)/200 (sec)) on the x-axis and voltage on the y-axis. The plot 1002 includes curves representing CLK_A and CLKA_S. The plot 1004 includes curves representing CLK_B and CLKB_S. The plot 1006 includes curves representing CLK_C and CLKC_S. The plot 1006 includes curves representing CLK_D and CLKD_S. As shown, the sequence of the primary clock signals, and thus the sequence of the secondary clock signals, is C, A, D, B. This means that the primary clock generator 206 (FIG. 2) generates CLK_C first among the primary clock signals CLK_A, CLK_B, CLK_C, and CLK_D. Thus, the secondary clock generator 222 generates CLKC_S first among the secondary clock signals CLKA_S, CLKB_S, CLKC_S, and CLKD_S. The primary clock generator 206 generates CLK_A second among the primary clock signals, and thus the secondary clock generator 222 generates CLKA_S second among the secondary clock signals. The primary clock generator 206 generates CLK_D third among the primary clock signals, and thus the secondary clock generator 222 generates CLKD_S third among the secondary clock signals. The primary clock generator 206 generates CLK_B fourth among the primary clock signals, and thus the secondary clock generator 222 generates CLKB_S fourth among the secondary clock signals. Although the signals CLK_A and CLK_D appear to be generated at the same time, CLK_A is generated just slightly before CLK_D. However, to prevent competing attempts to access the shared ADC 224, the secondary clock generator 222 generates the secondary clock signals in a distinctly non-overlapping manner. As shown, the secondary clock generator 222 generates CLKA_S only when CLK_A is low and when the remaining secondary clock signals are low. The same is true for CLKB_S relative to CLK_B and the remaining secondary clock signals, CLKC_S relative to CLK_C and the remaining secondary clock signals, and CLKD_S relative to CLK_D and the remaining secondary clock signals.

The sequence C, A, D, B repeats until the sequence changes due to clock drift at time=600. At this time, the phase sorter logic 708 determines that the sequence has changed from C, A, D, B to C, D, A, B. As described above, CLK_A almost imperceptibly preceded CLK_D from time=0 to 600, but over time, CLK_D almost imperceptibly precedes CLK_A starting at time=600. Accordingly, the phase sorter logic 708 provides new sequence signals SEL0-SEL3, altering the operation of the secondary clock generator 222 as described above and causing the sequence of secondary clock signals to become CLKC_S, CLKD_S, CLKA_S, and CLKB_S. The secondary clock generator 222 continues generating the secondary clock signals such that CFTS of the shared ADC 224 is maintained.

Figure 11:
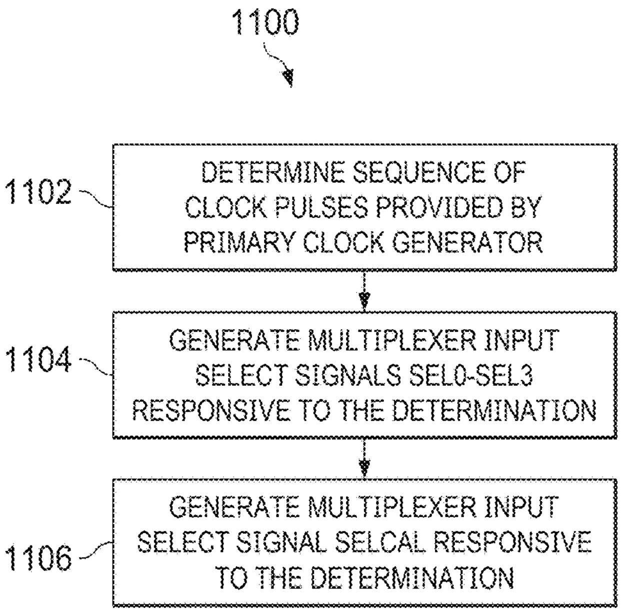
FIG. 11 is a flow diagram depicting a method of operating circuitry that facilitates circuit component sharing in various examples.
Figure 12:
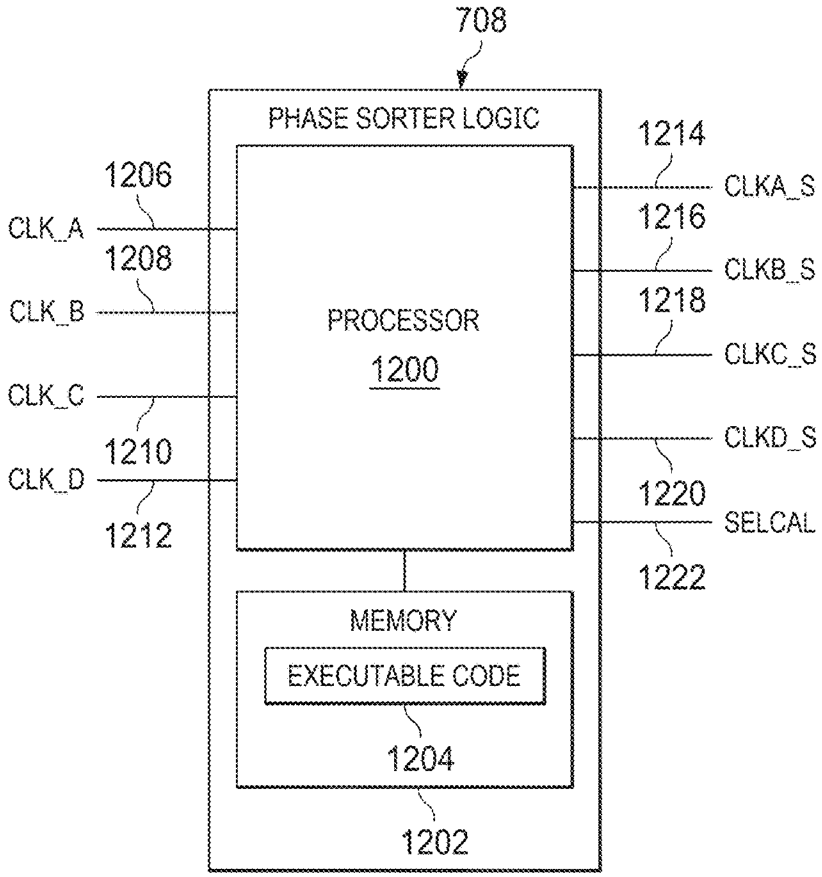
FIG. 12 is a block diagram of circuitry that facilitates circuit component sharing in various examples.

FIG. 11 is a flow diagram depicting the operation of circuitry that facilitates circuit component sharing in various examples. Specifically, FIG. 11 depicts a method of operation 1100 performed by the phase sorter logic 708 (FIGS. 7 and 8). FIG. 12 is an example block diagram of the phase sorter logic 708. In examples, the phase sorter logic 708 includes a processor 1200 and a memory 1202 coupled to the processor 1200. The memory 1202 stores executable code 1204. The processor 1200 performs some or all of the actions attributed herein to the phase sorter logic 708 responsive to executing the executable code 1204. Inputs 1206, 1208, 1210, and 1212 may be coupled to the primary clock generator 206, such as to the connections 210*a*-210*d*, respectively. In examples, the processor 1200 receives signals CLK_A, CLK_B, CLK_C, and CLK_D as input signals on the inputs 1206, 1208, 1210, and 1212, respectively. Outputs 1214, 1216, 1218, and 1220 of the processor 1200 are coupled to the select signal inputs of the multiplexers in the instances of circuitry 700, 702, 704, and 706, respectively. Output 1222 of the processor 1200 is coupled to the select signal input of the multiplexer 718. The processor 1200 may provide output signals CLKA_S, CLKB_S, CLKC_S, CLKD_S, and SELCAL on the outputs 1214, 1216, 1218, 1220, and 1222, respectively.

The operation of FIG. 12 is now described in parallel with FIGS. 8 and 11. The method 1100 includes the phase sorter logic 708 (e.g., the processor 1200) determining a sequence of clock pulses provided by the primary clock generator 206 (FIG. 2) (1102). For example, the primary clock generator 206 provides pulses in the clock signals CLK_A, CLK_B, CLK_C, and CLK_D, and the processor 1200 determines the sequence in which the pulses appear. For example, the sequence is a pulse in CLK_A, followed by a pulse in CLK_B, followed by a pulse in CLK_C, followed by a pulse in CLK_D. Thus, in this example, the sequence is A, B, C, D. The processor 1200 may store the determined sequence in the memory 1202.

The method 1100 includes the phase sorter logic 708 (e.g., the processor 1200) generating multiplexer input select signals SEL0-SEL3 responsive to the determination in block 1102 (1104). More specifically, each of the multiplexer input select signals is generated responsive to the sequence determined in block 1102 and the secondary clock signal provided by the instance of circuitry 700, 702, 704, or 706 to which the multiplexer input select signal SEL0-SEL3 is provided. For example, if the sequence determined in block 1102 is A, B, C, D, when generating SEL0, the phase sorter logic 708 (e.g., the processor 1200) selects a value of SEL0 that will cause the output signal of the FF 751 to pass through the multiplexer 756. The phase sorter logic 708 may generate SEL1, SEL2, and SEL3 in a manner similar to that in which SEL0 is generated.

The method 1100 includes generating a multiplexer input select signal SELCAL responsive to the determination of block 1102 (1106). The signal SELCAL indicates the final pulse in the sequence of pulses described above. For example, if the sequence described above is A, B, C, D, the phase sorter logic 708 generates SELCAL such that CLKD_S passes through the multiplexer 718.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

Uses of the term "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device, or a semiconductor component.

What is claimed is:

1. An electronic device, comprising:
a first switch having a terminal;
a second switch having first and second terminals;
a first capacitor having a terminal coupled to the terminal of the first switch and to the first terminal of the second switch;
a third switch having a terminal;
a fourth switch having first and second terminals;
a second capacitor having a terminal coupled to the terminal of the third switch and to the first terminal of the fourth switch;
an electronic component coupled to the second terminals of the second and fourth switches;
a first clock generator coupled to control terminals of the first and third switches, the first clock generator configured to provide first and second clock signals to control the first and third switches; and
a second clock generator coupled to control terminals of the second and fourth switches and to the first clock generator, the second clock generator configured to generate third and fourth clock signals to close the second and fourth switches at mutually exclusive times.

2. The electronic device of claim 1, wherein the second clock generator is configured to generate the third clock signal to close the second switch only when the first switch is open.

3. The electronic device of claim 2, wherein the second clock generator is configured to generate the fourth clock signal to close the fourth switch only when the third switch is open.

4. The electronic device of claim 1, wherein the first and third switches are adapted to be coupled to an Ethernet cable.

5. The electronic device of claim 1, wherein the second clock generator includes a first D flip-flop configured to provide a high signal during a time that the first switch is open.

6. The electronic device of claim 5, wherein the second clock generator includes a second D flip-flop configured to provide a high signal during a time that the fourth switch is open.

7. The electronic device of claim 6, wherein the second D flip-flop is configured to provide the high signal responsive to a falling edge of the fourth clock signal.

* * * * *